United States Patent [19]

Bally Berard et al.

[11] 3,953,797

[45] Apr. 27, 1976

[54] ELECTRONIC EQUIPMENT ASSEMBLY COMPRISING PLUG-IN MODULES AND TEST BARS

[75] Inventors: Yves Bally Berard, La Tronche; Paul Claudin; Claude Leymarie, both of Grenoble, all of France

[73] Assignee: Merlin Gerin, Grenoble, France

[22] Filed: Nov. 13, 1973

[21] Appl. No.: 415,408

[30] Foreign Application Priority Data
Nov. 20, 1972   France .................. 72.41212

[52] U.S. Cl. ................. 324/158 F; 324/73 PC
[51] Int. Cl.² ............... G01R 31/02; G01R 31/26
[58] Field of Search ......... 324/158 F, 73 R, 158, 324/73 PC

[56] References Cited
UNITED STATES PATENTS

| | | | |
|---|---|---|---|
| 2,823,304 | 2/1958 | Shiels | 324/158 F |
| 2,951,185 | 8/1960 | Buck | 324/158 F |
| 3,375,408 | 3/1968 | Buhrendorf et al. | 324/158 R |
| 3,665,303 | 5/1972 | Richards et al. | 324/73 R |
| 3,801,910 | 4/1974 | Quinn | 324/158 R |
| 3,808,532 | 4/1974 | Yuska | 324/158 F |
| 3,830,956 | 8/1974 | Wootton et al. | 324/73 PC |

*Primary Examiner*—R. V. Rolinec
*Assistant Examiner*—Ernest F. Karlsen
*Attorney, Agent, or Firm*—Stevens, Davis, Miller & Mosher

[57] ABSTRACT

A rack-mounted electronic equipment module having plug-in normal-service contacts for engagement with the connector panel of a cabinet. The module comprises, preferably on the front edge of the module card, a plurality of aligned test contacts cooperating with a removable plug-in test bar. A single test bar may be provided to test the operation of several modules.

5 Claims, 4 Drawing Figures

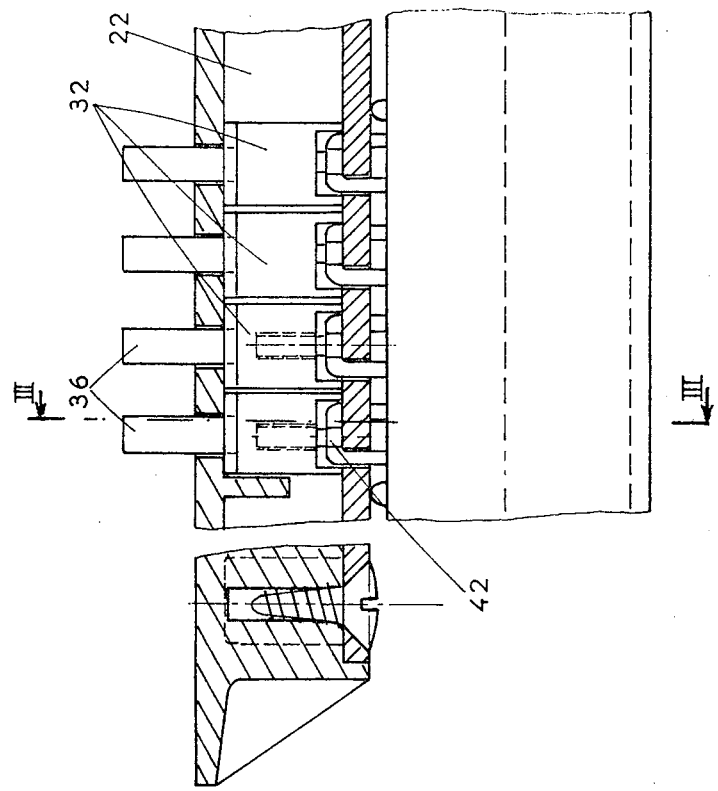
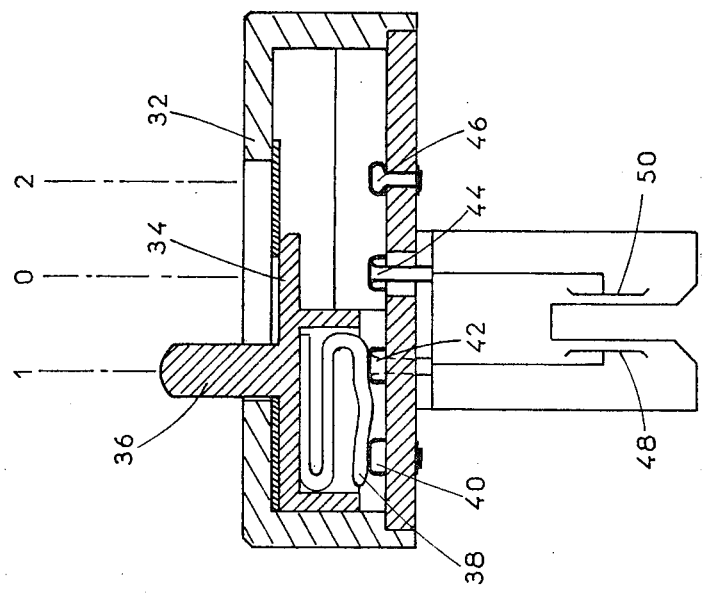
Fig. 2
Fig. 3

ELECTRONIC EQUIPMENT ASSEMBLY COMPRISING PLUG-IN MODULES AND TEST BARS

This invention relates to electronic equipment assemblies comprising plug-in module cards adapted for mounting in a cabinet, and pertains more particularly to simplified test means permitting the testing of the operation of selected cards.

Electronic equipment modules, such as printed-circuit boards or packaged assemblies of wired components, are now widely used in computers or other electronic apparatus. Generally, a cabinet houses a plurality of closely spaced-apart module cards which are individually slidably mounted in slots of shelves or racks (or drawers) of the frame of the cabinet whereby the electric connection of the modules to the wiring of the cabinet is ensured by a plurality of normal-service (as opposed to "test") contacts which are aligned along one edge of the modules, generally the back edge, thereof. The contacts are adapted for plug-in engagement with a corresponding set of stationary connector contacts carried by the connector panel (generally the back panel) of the cabinet and which are in turn connected to the wiring of the cabinet. The wiring interconnects the circuitry of the modules plugged in the connector panel and connects the terminals of the module cards to the input and output lines. The plug-in mounting of the modules in the cabinet permits the rapid exchange of defective cards as soon as the latter have been identified but the search for defective modules may be very cumbersome in conventional prior art equipment. Normally, test and isolating points or tabs are incorporated into the equipment of the cabinet, such as in the wiring or at the connection points. Known systems require the intervention of an expert who alone is qualified for repairing without causing damage to the installation. The test means utilized by the serviceman must be compact in order to save space and the necessity to equip each module with such miniaturized test means increases the cost of the installations.

It is an object of the invention to provide an electronic equipment module assembly comprising simplified and rugged test means which may be operated by laymen and which permit the testing of the operation of the modules without disconnecting of the modules from the connector panel of the cabinet and without interruption of the normal functioning of the installation.

It is another object of the invention to provide single test means capable of cooperating by simple plug-in engagement with numerous modules thereby decreasing the total bulk of the test equipment and saving time during the checkout and fault detection operations.

It is a further object of the invention to provide simplified test means permitting by a simple switching operation to isolate from the terminal thereof a predetermined electronic circuit of a module to be tested; to simulate a control signal delivered at said terminal; and to leave unchanged the operation of said circuit.

These and other objects and advantages of the invention will become apparent upon reading of the following description of an embodiment of the invention given by way of example only and shown schematically in the appended drawings, in which:

FIG. 2 is a partial plan view, partially in cross section, of a test bar according to FIG. 1;

FIG. 3 is a cross section along the lines III—III of FIG. 2; and

Figure 1:
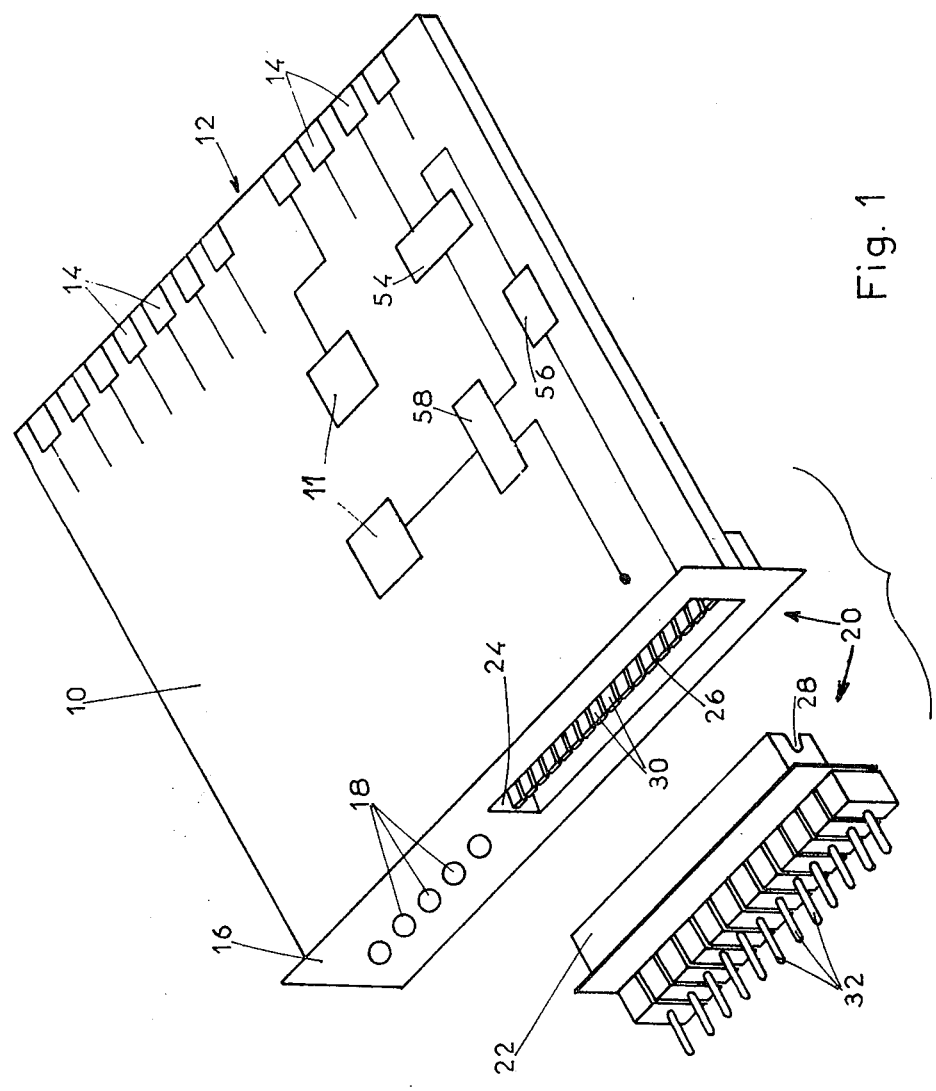
FIG. 1 is a perspective view of a printed-circuit module associated with a test bar shown in disconnected position.

In the figures a card or module 10 supports electronic components or micro-packages 11 which are interconnected by printed-circuit leads, the input and output terminals of which are grouped along the rear edge 12 of the module 10 as a plurality of normal-service plug-in contact strips 14 adapted for engagement with a corresponding plurality of registering mating contacts (not shown) supported by the connector panel of a cabinet (not shown) in which a large number of closely spaced-apart modules are juxtaposed or superposed and individually slidably mounted on racks or shelves in a well-known manner. The module carries on the front edge thereof a perpendicularly extending front panel band 16 equipped with indicator lamps 18. The front edge is adapted to cooperate with a test assembly, generally designated by the numeral 20, in a manner which will be explained in more detail hereinafter. The front panel bands 16 of the different juxtaposed or superposed cards 10 in plugged-in position constitute a virtually continuous front face.

The test assembly 20 is comprised of a removable test bar 22 which may be plugged on the front edge 26 of the module 10 through an opening 24 defined by band 16. The test bar 22 comprises a plurality of linearly aligned contact sockets 28 which can engage in plug-in relation a plurality of registering mating contacts 30 comprising, in the embodiment shown, conducting strips 30 carried by the front edge 26 of the module 10. The contacts 28 and 30 constitute a test connector assembly as opposed to the input and output normal-service connector contacts located at the rear edge 12 of the module.

Referring now to FIGS. 2 and 3, there is shown a test fixture formed by a test bar 22 comprising a plurality of triple-throw hand-operated switches 32 which are juxtaposed along the bar 22. The switches are all of identical structure and only one of them will now be described in detail. A slide member 34 having a control finger or lever 36 can occupy three distinct positions designated in FIG. 3 by the numerals 1, 0 and 2, respectively. The slide member 34 carries a contact spring 38 constituting a bridging contact and shaped to connect two adjacent tabs of four tabs 40, 42, 44 and 46, thereby defining the positions 1, 0 and 2. In position 1 the spring electrically connects the tabs 40 and 42; in position 0 the tabs 42 and 44; and in position 2 the tabs 44 and 46. The tabs 42 and 44 are connected to the contact lips 48 and 50, respectively, constituting a socket contact 28 of the test connector. The tabs 40 and 46 are electrically connected to a common supply conductor.

Figure 4:
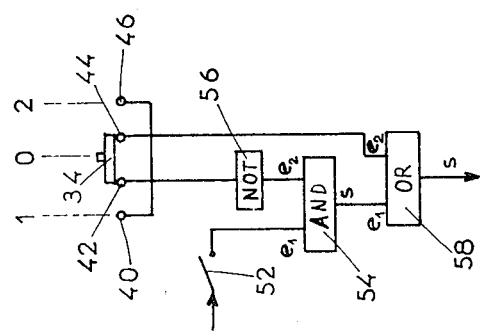
FIG. 4 shows the electronic diagram of a test circuit.

Each switch 32 is associated, after plugging-in of the test bar 22, with an input or output circuit of the module 10 and one of these circuits, in the embodiment shown an input circuit, is schematically represented in FIG. 4 and indicated in FIG. 1. An input 52 of the module 10 is connected to the input $e_1$ of an AND-gate 54, having a second input $e_2$ connected through an inverter 56, having a NOT function, to the tab 42. The output s of the AND-gate 54 is connected to the first input $e_1$ of an OR-gate 58 having a second input $e_2$ which is connected to the tab 44. The output s of the OR-gate 58 is connected to the corresponding circuit schematically designated by the numeral 11 in FIG. 1 of the module 10. The input 52 may be connected to the common supply conductor which is connected to the tabs 40 and 46, as stated above.

In the neutral or inoperative position 0 of the switch shown in FIG. 4, no signal is applied to the tabs 42 and 44. As a result, the inverter 56 enables the $e_2$-input of the gate 54 so that the latter simply transmits to the $e_1$-input of the gate 58 the signal appearing at the $e_1$-input of gate 54. The gate 58 in turn simply transmits this signal as the $e_2$-input of the gate 58 is disabled by the absence of any signal on tab 44. As a consequence, the input circuit of the module behaves normally as if no logic test circuit were inserted or as if the test bar 22 were disconnected in which case no signal would be applied to the tabs 42 and 44.

The moving of the sliding member 34 towards the position 1 produces a signal on tab 42 which is then connected to the tab 40 so that the signal inverted by the gate 56 disables the $e_2$-input of the AND-gate 54. Any signal which might appear at the input 52 is now prevented from transmission to the circuit 11 so that the latter is isolated from the input 52.

A moving of the slide member 34 towards the position 2 applies a signal to the tab 44 which enables the $e_2$-input of the OR-gate 58 so that the latter transmits this signal whatever may be the state of the $e_1$-input thereof. The position 2 corresponds thus to a simulation of an input signal applied to the circuit 11 of the module.

Those skilled in the art will have no difficulty in adapting the logic test circuit to an output circuit of the module 10 in which case the inputs and outputs are simply inverted.

The different input and output circuits of the module 10 are equipped with logic test circuits 54, 56, 58 and with contacts 30 cooperating with the contacts 28 of the test bar in the above-described manner. To check-out or test a module, the test bar 22 is plugged on the module and the switches 32 are operated. The operation of the modules equipped with a plugged-on test bar is not affected as long as all the switches 32 are in the 0-position. One or more input or output circuits of a module are tested by placing the corresponding switches 32 in the desired position: position 1 to isolate the circuits from the terminal thereof and position 2 to simulate a control order at the terminal. The testing is particularly simple and requires no changing of the interconnections or of the connections of the modules to the incoming and outgoing circuits thereof. After having tested a module by plugging-on of the test bar, the latter may be withdrawn and plugged on another module to test the latter. Of course, a plurality of test bars 22 may be left plugged on several modules. The test bars may also be used to temporarily replace subsequently to be installed modules. In this case, the simulation position of the corresponding test switches permits to simulate the signal issued by the future module. The same may be done in case of a temporarily withdrawn module which is to be replaced by another or which is to be repaired.

What is claimed is:

1. An assembly comprising
   a plug-in electronic equipment module having a first edge portion carrying a plurality of normal-service contacts for engagement in plug-in relation with a plurality of registering mating contacts supported by a connector panel, and a second edge portion carrying a first plurality of aligned test contacts, and
   a test fixture comprising a test bar having a second plurality of aligned test contacts, said second plurality of test contacts mating with and being in registration with said first plurality of test contacts; a plurality of switches each having a bridging contact, one of said switches being associated with each of said second plurality of test contacts; a plurality of sets of conductive tabs, one of said sets of tabs being associated with each of said second plurality of test contacts and having a first group electrically connected to the corresponding test contact and a second group for connection to an external voltage source, the bridging contact on the associated switch being movable to electrically connect selected tabs of said first and second groups, said test fixture permitting the testing of the operation of said module in its plug-in position.

2. An assembly as set forth in claim 1, in which there are four conductive tabs in each set, two of said tabs being connected through associated ones of said first and second pluralities of mating test contacts to portions of circuitry on said module and the other two tabs being connected to said voltage source, said switch being movable between first, second and third positions in which the bridging contact on said switch connect selected pairs of said four conductive tabs.

3. An assembly comprising:
   a plug in electronic equipment module having a plurality of to be tested electronic equipment parts, a first edge portion carrying a plurality of normal-service contacts connected to said parts and adapted for engagement in plug-in relation with a plurality of registered mating contacts supported by a connector panel, a second edge portion carrying a first plurality of generally aligned test contacts, and a plurality of electronic logic gate means interconnecting predetermined terminals of respective ones of said electronic equipment parts to respective ones of said test contacts; and
   a removable plug-in test bar having a second plurality of generally aligned test contacts mating with and being in registration with the test contacts of said first plurality for engagement in plug-in relation therewith, and a plurality of generally aligned switches associated with corresponding ones of said test contacts of said second plurality to permit the testing of the operation of corresponding ones of said electronic equipment parts in plug-in position of said test contacts of said first and second pluralities and of said normal-service contacts and said mating contacts of said cabinet, respectively, each switch of said plurality having at least an inoperative position in which the normal operation of the corresponding electronic equipment part is not affected by the test bar plugged on the module and an operative position in which a signal is delivered to said part via the corresponding electronic gate means.

4. An assembly according to claim 3, each switch of said plurality having a second operative position in which the corresponding electronic gate means isolates at least one of the terminals of the corresponding electronic equipment part.

5. An assembly according to claim 3, said module having a generally rectangular shape, said normal-service contacts being aligned on the rear edge of said module, said test contacts of said first plurality being arranged on the front edge thereof.

* * * * *